(12) United States Patent
Seshan et al.

(10) Patent No.: US 7,056,817 B2
(45) Date of Patent: Jun. 6, 2006

(54) FORMING A CAP ABOVE A METAL LAYER

(75) Inventors: Krishna Seshan, San Jose, CA (US); Kevin Jeng, Cupertino, CA (US); Haiping Dun, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 10/300,253

(22) Filed: Nov. 20, 2002

(65) Prior Publication Data

US 2004/0094836 A1   May 20, 2004

(51) Int. Cl.
*H01L 21/44* (2006.01)
(52) U.S. Cl. ...................................... 438/612
(58) Field of Classification Search ................ 438/612
See application file for complete search history.

(56) References Cited

U.S. PATENT DOCUMENTS

| 5,239,191 | A | 8/1993 | Sakumoto et al. | |
| 5,554,940 | A | 9/1996 | Hubacher | |
| 5,783,868 | A | 7/1998 | Galloway | |
| 6,265,300 | B1 | 7/2001 | Bhansali et al. | 438/612 |
| 6,376,899 | B1 | 4/2002 | Seshan et al. | 257/620 |
| 6,429,532 | B1 | 8/2002 | Han et al. | |
| 6,534,853 | B1 * | 3/2003 | Liu et al. | 257/692 |
| 2002/0173133 | A1 * | 11/2002 | Towle et al. | 438/612 |

FOREIGN PATENT DOCUMENTS

| EP | 1 176 637 | 1/2002 |
| JP | 04 142053 | 5/1992 |

* cited by examiner

*Primary Examiner*—Matthew Smith
*Assistant Examiner*—Thanh V. Pham
(74) *Attorney, Agent, or Firm*—Trop, Pruner & Hu, P.C.

(57) ABSTRACT

In one embodiment, the present invention includes an apparatus having a metal layer with a pad disposed above a substrate; and a cap disposed above the metal layer having a first portion to provide for contact with a probe and a second portion to provide a bonding surface, and the cap is electrically coupled to the pad.

7 Claims, 5 Drawing Sheets

FORMING A CAP ABOVE A METAL LAYER

BACKGROUND

The present invention relates to the manufacture of semiconductor devices and more particularly to the formation of a cap to protect an underlying metal layer.

Manufacture of semiconductor devices typically involves a series of processes in which various layers are deposited and patterned on a substrate to form a device of the desired type. Many semiconductor devices have a number of metal layers formed thereon and interconnected using vias. Typically, the top metal layer may have pads that are used for interconnection and sort probing. In certain devices, a cap is formed above the top metal layer to provide a location to bond wires for electrical connections. Further, the cap may be used to protect the metal layer during sort probing.

However, problems exist with formation of the cap. As a result of misalignment of the cap, a portion of the metal layer is exposed, which is undesirable, as the metal layer is unstable in an ambient environment. Also, the force of a sort probe on the cap can cause probe marks, which can also expose portions of the metal layer and even cause cracking of the metal layer, which can propagate to the lower metal layers, either immediately or during the later bonding. Thus a need exists to protect and to avoid exposure of the underlying metal layer.

DETAILED DESCRIPTION

Figure 1A:
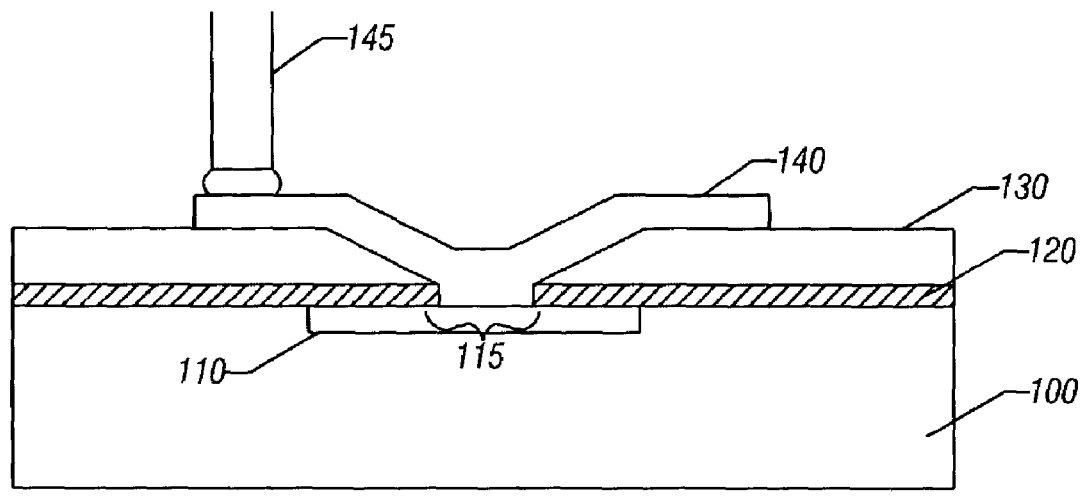
FIG. 1A is a partial cross-section view of a semiconductor device in accordance with one embodiment of the present invention.

FIG. 1A is a partial cross-section view of a semiconductor device in accordance with one embodiment of the present invention. As shown in FIG. 1A, a metal layer 110 is disposed on a layer 100, which may be an underlying substrate or a layer disposed thereon. In one embodiment, the metal layer may be copper (Cu). Further in one embodiment this metal layer may be the sixth metal layer (M6), which is often the final metal layer of a semiconductor device. In many semiconductor devices, this top metal layer 110 may act as a terminal layer and may include one or more pads for probing and wire bonding. Disposed above metal layer 110 is a first passivation layer 120 and a second passivation layer 130. In one embodiment, first passivation layer 120 may be a nitride film and second passivation layer 130 may be polyimide. While shown as two layers in the embodiment of FIG. 1A, it is to be understood that in other embodiments, a single passivation layer (or alternately no passivation layer) may be present.

As shown in FIG. 1A, an opening is provided in passivation layers 120 and 130 so that a portion of metal layer 110 may be exposed. As shown in FIG. 1, exposed portion 115 of metal layer 110 may be in electrical contact with a cap layer 140 ("cap layer" or "cap"), which is disposed above the second passivation layer 130. In one embodiment, cap layer 140 may be titanium-aluminum (Ti—Al). However it is to be understood that in other embodiments, other caps such as gold, silver, titanium alloy, aluminum, combinations thereof, or other conducting materials may be used.

This cap layer 140 thus may electrically contact metal layer 110 and provide protection for metal layer 110. This protection may include environmental protection, so that metal layer 110 does not come in contact with the ambient environment, and physical protection to avoid deformation, cracking or other defect on all or a portion of metal layer 110.

As will become apparent in the discussion of further figures, cap layer 140 may be designed to be substantially larger than exposed portion 115 of metal layer 110. In such manner, cap layer 140 may include one or more contact surfaces or areas that are laterally removed from exposed portion 115. In one embodiment, these one or more contact surfaces may be used for probing and bonding. These contact surfaces may include one or more bonding pads and probing pads (also referred to as "bond pads" and "probe pads"). At least these area(s) of cap layer 140 are not in vertical alignment with exposed portion 115; these area(s) do not directly overlie exposed portion 115.

Also shown in FIG. 1A is a conductor or lead 145. In one embodiment, lead 145 may be a wire enclosed in a capillary housing having a wire ball at the end thereof for bonding to a bond pad of cap layer 140. As shown, lead 145 is laterally removed from exposed portion 115. Further, while not shown in FIG. 1A, it is to be understood that probing of cap layer 140 may similarly occur laterally removed from exposed portion 115, for example, on a probing pad. Accordingly, the stress caused by probing cap layer 140 or bonding leads or other electrical components thereto do not impact metal layer 110. Even more, in certain embodiments, probing and bonding may occur directly overlying areas of a substrate lacking metal layer 110.

While it is to be understood that dimensions may vary in different embodiments, the following respective dimensions may be used in one embodiment. Specifically in such an embodiment, the opening in passivation layer 120 may be generally square in shape and have sides between approximately 10 to 100 microns (μm). Further in this embodiment, cap layer 140 may also be generally square and have sides between approximately 25 μm to 50 mils. Such dimensions and shapes in various embodiments may allow for a region of cap layer 140 to be used for probing and bonding that is, while electrically connected to metal layer 110, laterally removed from exposed portion 115.

Figure 1B:
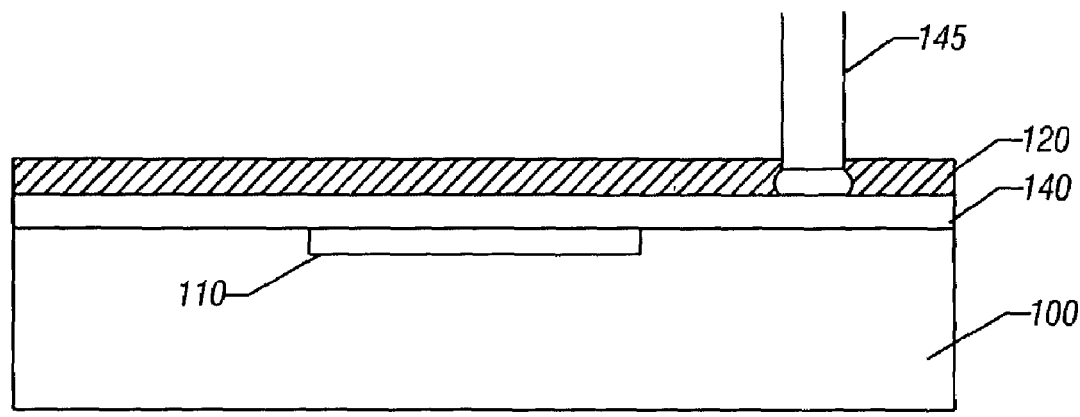
FIG. 1B is a partial cross-section view of a semiconductor device in accordance with a second embodiment of the present invention.

Referring now to FIG. 1B, shown is a partial cross-section view of a semiconductor device in accordance with a second embodiment of the present invention. The reference numerals of FIG. 1B correspond to those in FIG. 1A. In this embodiment, cap layer 140 is disposed between metal layer 110 and passivation layer 120. In other respects, this second embodiment may be similar to that of FIG. 1A, although lead 145 is shown on the right side of metal layer 110. To accommodate lead 145, a portion of passivation layer 120 may be removed to provide an opening to cap layer 140. In certain embodiments, this opening may be accomplished via a photolithography process alone, if passivation layer 120 is formed of a photosensitive material. In other embodiments, etching may also be performed to remove the desired portion of passivation layer 120. Further, while not shown in FIG. 1B, it is to be understood that in certain embodiments, similar opening(s) may be provided in passivation layer 120 to provide a probing pad on cap layer 140.

Figure 2:
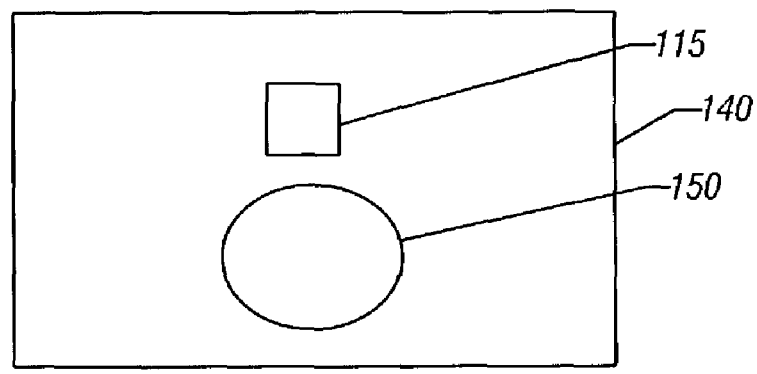
FIG. 2 is a top view of a cap layer in accordance with one embodiment of the present invention.

Referring now to FIG. 2, shown is a top view of the embodiment of the device of FIG. 1A. As shown in FIG. 2, cap layer 140 has a generally rectangular shape and a substantially larger area than the exposed portion 115 of metal layer 110. Further shown in FIG. 2 is area 150, which is laterally displaced from exposed portion 115. This area 150 may be a contact surface used for probing and bonding activities. While shown as a generally oval shape in FIG. 2, it is to be understood that area 150 may encompass any desired shape, as it is reflects a predetermined area for probing and bonding. Regardless of the nature of the contact made to area 150 during probing or bonding activities, metal layer 110 will not become exposed or damaged. While shown in FIG. 2 as a single area, it is to be understood that in certain embodiments, more than one contact surface may be used for probing and bonding. More so, the discussion and figures show only a single portion of cap layer 140 and a single portion of metal layer 110. However, it is to be understood that in certain embodiments, a semiconductor device may include a number of such caps and metal portions.

Figure 3:
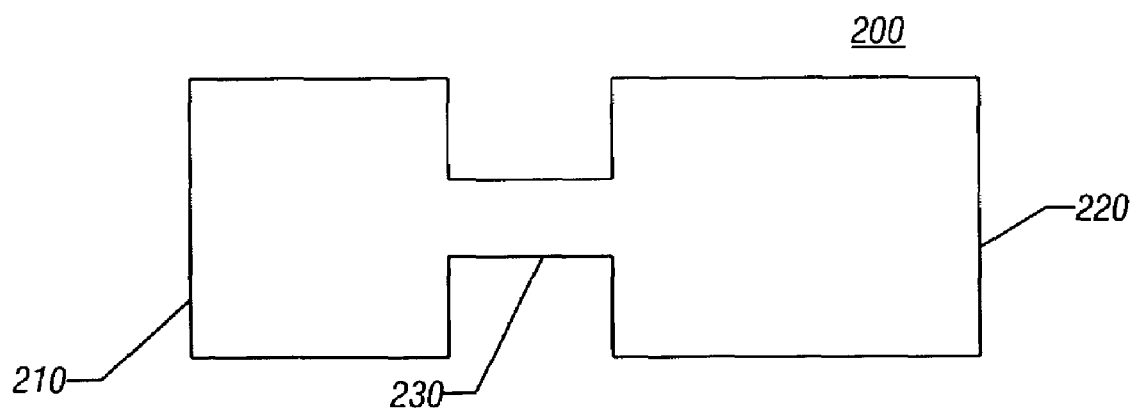
FIG. 3 is a top view of a cap layer in accordance with another embodiment of the present invention.

Referring now to FIG. 3, shown is a top view of another embodiment of a cap layer. As shown in FIG. 3, cap layer 200 includes a first region 210, a second region 220, and an interconnection region 230. While not shown in FIG. 3, it is to be understood that cap layer 200 may be located above the underlying layers of FIG. 1A. In one embodiment, first region 210 may be used as a probing pad and second region 220 may be used as a bonding pad. Interconnection region 230 may be used to electrically connect regions 210 and 220. While it is to be understood that dimensions may vary in different embodiments, in certain embodiments, first region 210 may have a generally square shape and have sides between approximately 25 µm to 50 mils. Further, in such embodiments second region 220 may be generally rectangular and have a length between approximately 30 µm and 50 mils, and a width between approximately 25 µm and 50 mils. Furthermore, while the distance may vary in certain embodiments, there may be approximately 10 µm and 400 mils spacing between the first region 210 and the second region 220.

As discussed above, these regions are electrically connected via interconnection region 230. Because cap layer 200 is substantially larger than the opening to metal layer 110, it may be formed so that it electrically connects to metal layer 110 via exposed portion 115. In various embodiments, cap layer 200 may be patterned so that exposed portion 115 of metal layer 110 is located below interconnection region 230 or a location of regions 210 or 220 that is laterally removed from the probing and bonding operations.

Other configurations may be present in certain embodiments. For example, in one embodiment, one or more probing pads of a cap layer may be located generally around a middle portion of a semiconductor die, while one or more bonding pads of the cap layer may be located generally around a periphery of the semiconductor die. These probe pads and bond pads may be interconnected as desired by lines of the cap layer. In other embodiments, the bond pads may be located around the middle portion while probe pads may be located around the periphery.

Figure 4:
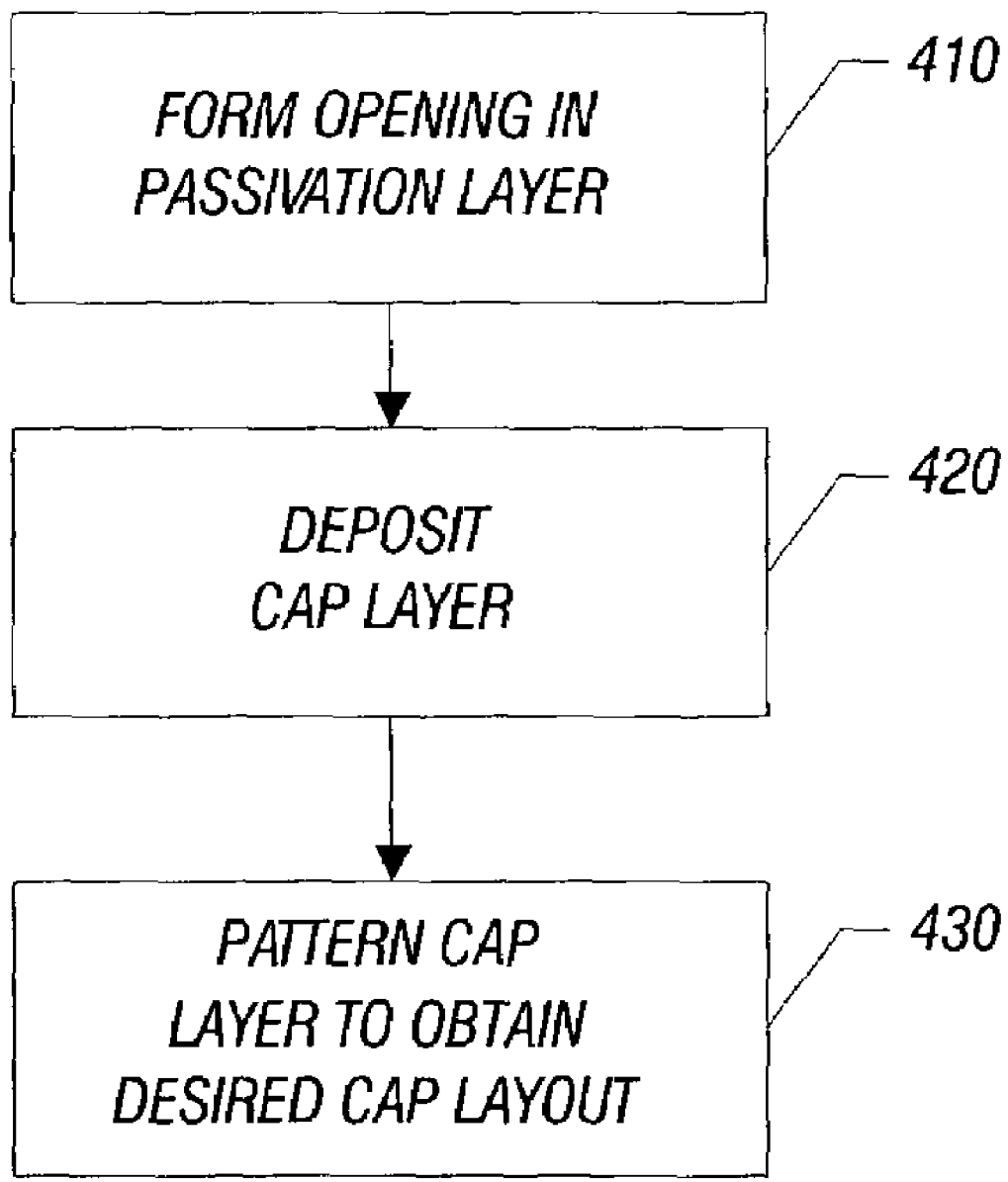
FIG. 4 is a flow diagram of a process in accordance with one embodiment of the present invention.

FIG. 4 is a flow chart of an example process in accordance with one embodiment of the present invention. This flow chart relates to the structure shown in FIG. 1A, in which at least one passivation layer is interposed between metal layer 110 and cap layer 140. As shown in FIG. 4, a cap layer may be formed by first forming an opening in the passivation layer (block 410). Next, the cap layer may be deposited (block 420). Then, the cap layer may be patterned to obtain the desired cap layout (block 430). As discussed above, in various embodiments, the cap layer may take various shapes and sizes.

In one embodiment, the opening in the passivation layer(s) may be accomplished by patterning the passivation layer(s) using well known photolithographic processes. For the embodiment of FIG. 1A, passivation layer 130 may be a photosensitive polyimide. As such, a mask may be aligned without first applying a photoresist layer. Next, passivation layer 130 may be exposed and developed to reveal the desired pattern (i.e., opening(s) to passivation layer 120). Next, the portion(s) of passivation layer 120 providing the opening(s) to the underlying metal layer may be removed, for example, by etching. In such manner, the opening formed is auto-registered via use of passivation layer 130 to mask the remaining portions of passivation layer 120.

Thus an opening is provided in the passivation layer(s) to expose the metal pad of the metal layer. In various embodiments, this opening may be in accordance with the dimensions described above. Of course, it is to be understood that a number of such openings may be patterned in the passivation layer(s) to permit contact between pads of a metal layer and pads of a cap layer.

In one embodiment, depositing the cap layer may be accomplished by a technique in which a titanium-aluminum cap is blanket deposited via sputtering. In such an embodiment, first a layer of titanium may be deposited to act as an adhesion layer. In various embodiments, this adhesion layer may have a thickness between approximately 500 Angstroms to 1500 Angstroms. In other embodiments, this adhesion layer may be chromium, nickel vanadium, or molybdenum, for example. Next, the remaining portion of the cap layer, which may be aluminum in one embodiment, may be sputtered above the adhesion layer. In various embodiments, the cap layer may have a thickness of between approximately 0.75 µm to 1.5 µm.

After the cap layer is deposited, it may then be patterned to obtain the desired cap layout. In one embodiment, such patterning may be accomplished using well known photolithographic techniques. For example, a photoresist layer may be applied above the cap layer. In one embodiment, the photoresist layer may be applied by spinning the photoresist onto the substrate and then baking the substrate. Then, a mask may be aligned and the photoresist layer may be exposed and developed, exposing the undesired portions of the cap layer.

Next the undesired portions of the cap layer may be removed. In one embodiment, the removal may be via wet etching. After the undesired portions of the cap layer have been removed, the remaining portions of the photoresist layer protecting the desired portions of cap layer may be removed, leaving the patterned cap layer.

In such manner, a cap layer in accordance with one embodiment of the present invention may be formed. After such formation, probing and bonding may occur on the cap layer.

Figure 5:
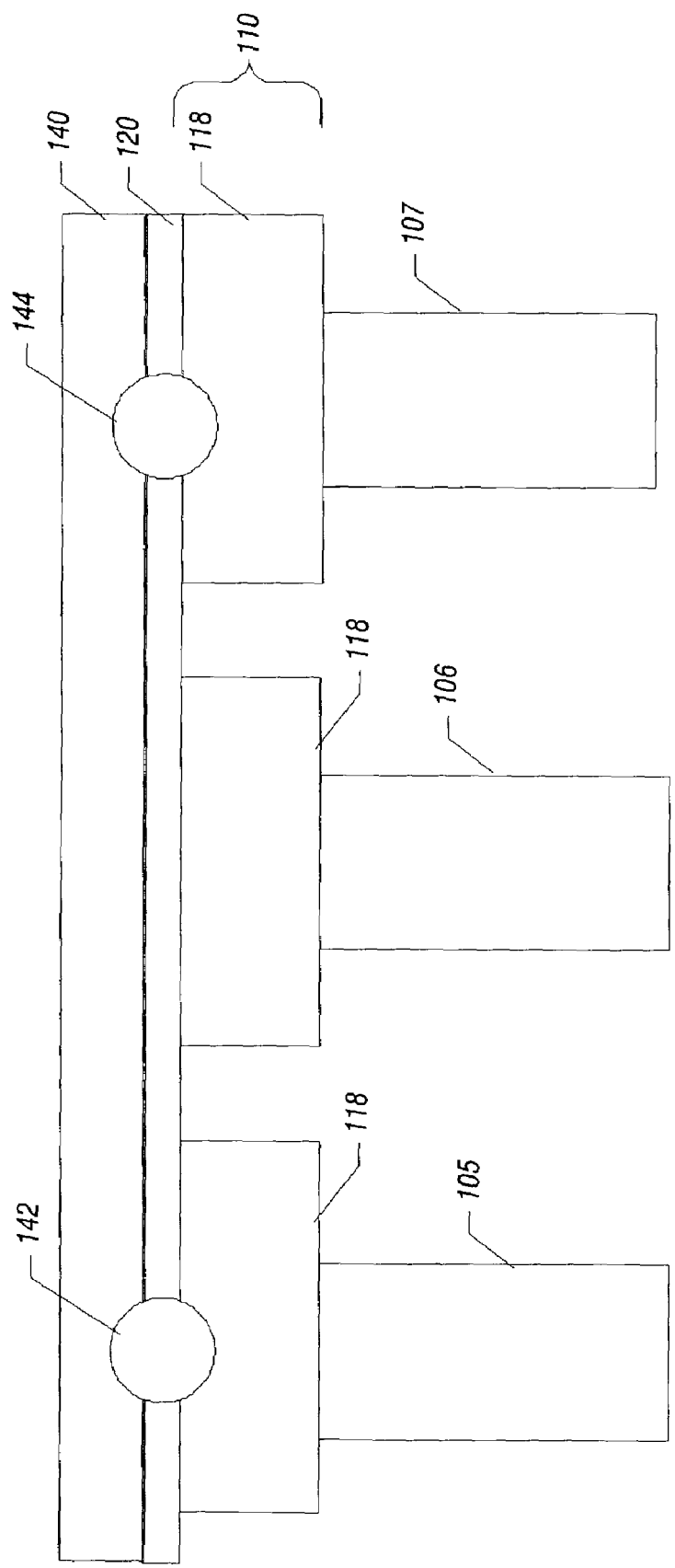
FIG. 5 is a partial cross-section view of a semiconductor device in accordance with a third embodiment of the present invention.

Referring now to FIG. 5, shown is a partial cross-section view of a semiconductor device in accordance with a third embodiment of the present invention. As shown in FIG. 5, cap layer 140 is disposed above a metal layer 110, which is subdivided into a number of pads 118 (also referred to as "subpads"). Disposed between cap layer 140 and the metal layer 110 is a passivation layer 120. Cap layer 140 is connected to metal layer 110 by vias 142 and 144. It is to be understood that in other embodiments, vias may be placed on each pad 118, or they may be selectively located, as desired. While shown schematically in FIG. 5 as circles, it is to be understood that these vias may be formed in accordance with the above discussion by forming openings in passivation layer 120 and depositing cap layer 140 thereon.

By providing cap layer 140 in accordance with this embodiment, metal layer 110 may be formed as a plurality of smaller pads or subpads. In such manner, cap layer 140 may be connected to different circuitry (e.g., different voltage sensitive circuits) by selection of the appropriate via (e.g., via 142 or 144). FIG. 5 shows that each pad 118 of metal layer 110 is connected to a respective conductor 105–107. These conductors may be used to connect selected pads 118 to different underlying circuits. For example, conductor 105 may be used to connect a first underlying circuit (not shown in FIG. 5) to cap layer 140 using via 142, while a second underlying circuit (not shown in FIG. 5) may be connected to cap layer 140 using via 144. In such manner, a test probe applied to cap layer 140 may alternately test either of the underlying circuits using the same probe pad on cap layer 140. Of course, in other embodiments, additional underlying circuits, conductors, and subpads may be provided.

Figure 6:
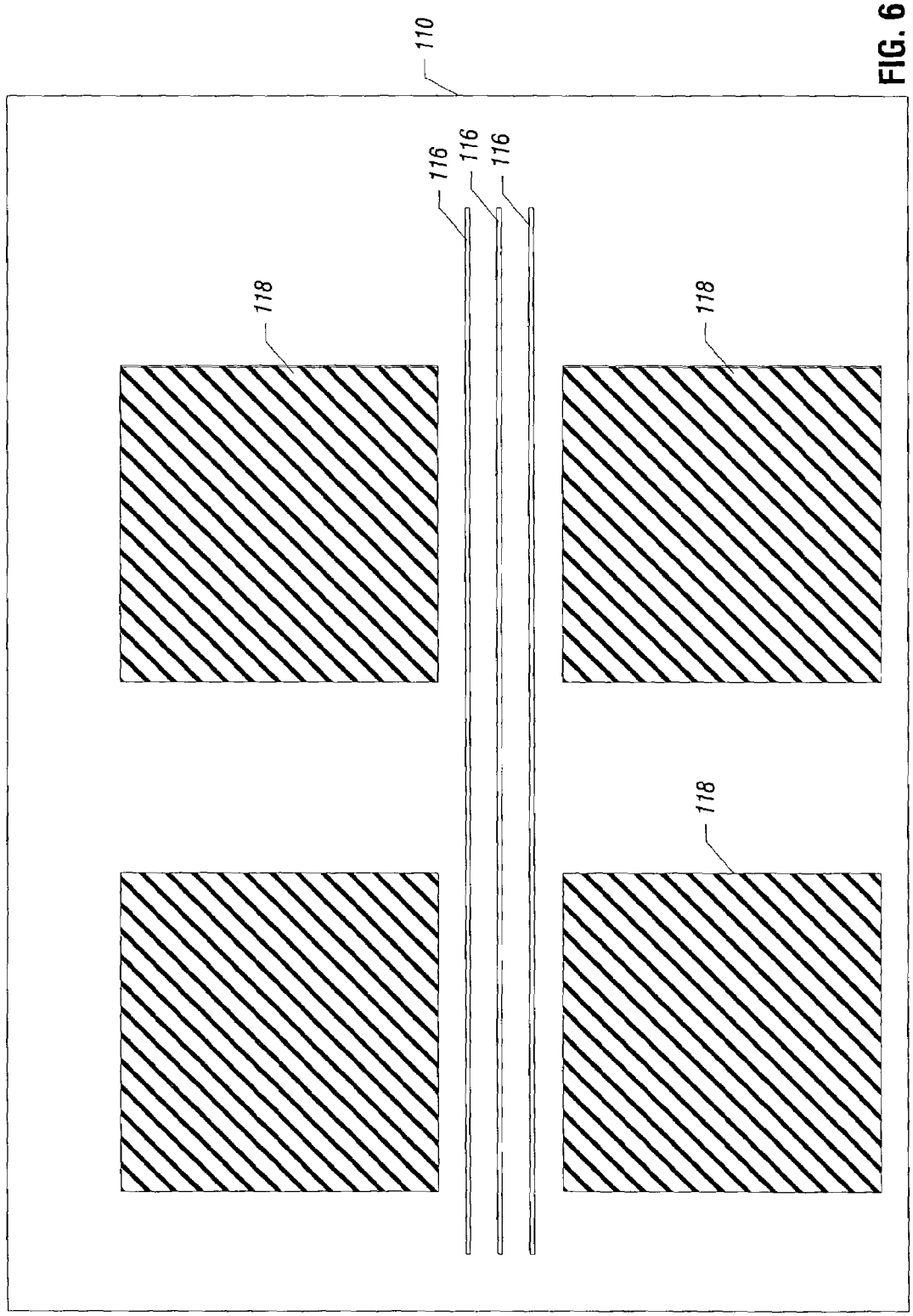
FIG. 6 is a top view of a cap layer in accordance with the third embodiment of the present invention.

Similarly in this embodiment, because metal layer 110 is broken into smaller pads, conductors can be provided between the pads to connect different circuitry or pads, as desired. Referring now to FIG. 6, shown is a top view of metal layer 110 in this embodiment. As shown in FIG. 6, metal layer 110 is divided into a plurality of subpads 118. While shown in FIG. 6 as having a generally square shape, in other embodiments, the subpads may take different shapes. In certain embodiments, each subpad 118 may have an area of between approximately 50 and 200 square microns, and in one embodiment approximately 100 square microns. In this embodiment, because metal layer 110 is divided, one or more conductors 116 may be routed between subpads 118. These conductors 116 may be used to connected different circuitry of the semiconductor device, as desired, and may be formed using standard photolithography techniques.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a metal layer with a first subpad coupled to a first circuit and a second subpad coupled to a second circuit; and
    forming a cap layer over the metal layer, wherein a contact surface of the cap layer can be selectively coupled to the first circuit or the second circuit.

2. The method of claim 1, further comprising forming a passivation layer between the metal layer and the cap layer.

3. The method of claim 2, further comprising forming an opening in the passivation layer to expose the first subpad and the second subpad.

4. The method of claim 3, further comprising forming a first via to couple the first subpad to the cap layer and a second via to couple the second subpad to the cap layer.

5. The method of claim 1, further comprising selectively testing the first circuit or the second circuit via a probe coupled to the contact surface of the cap layer.

6. The method of claim 1, further comprising forming at least one conductor in the metal layer between the first subpad and the second subpad.

7. The method of claim 6, wherein the at least one conductor is coupled to a third circuit unrelated to the first circuit and the second circuit.

* * * * *